United States Patent
Chang

(10) Patent No.: US 9,331,696 B2
(45) Date of Patent: May 3, 2016

(54) SIGNAL SENSING CIRCUIT

(71) Applicant: EGALAX_EMPIA TECHNOLOGY INC., Taipei (TW)

(72) Inventor: Chin-Fu Chang, Taipei (TW)

(73) Assignee: EGALAX_EMPIA TECHNOLOGY INC., Taipei (TW)

( * ) Notice: Subject to any disclaimer, the term of this patent is extended or adjusted under 35 U.S.C. 154(b) by 526 days.

(21) Appl. No.: 13/792,960

(22) Filed: Mar. 11, 2013

(65) Prior Publication Data

US 2013/0234737 A1 Sep. 12, 2013

Related U.S. Application Data

(60) Provisional application No. 61/609,466, filed on Mar. 12, 2012.

(51) Int. Cl.
  *H03F 3/68* (2006.01)
  *H03K 19/00* (2006.01)
  *G01R 27/26* (2006.01)
  *H03M 1/34* (2006.01)

(52) U.S. Cl.
  CPC ........ *H03K 19/0005* (2013.01); *G01R 27/2605* (2013.01); *H03M 1/34* (2013.01)

(58) Field of Classification Search
  CPC .. H03F 3/3022; H03F 3/45475; H02M 3/156; H02M 3/158; H03K 3/012; H03K 3/013; G01R 27/2605; G01R 27/26
  USPC ........ 324/713, 327, 108, 109, 609, 323, 679, 324/771, 124, 97, 519, 762.03, 606, 647, 324/656, 665, 672, 676, 683, 705, 686, 324/750.17, 754.28, 658; 330/263, 264, 330/255
  See application file for complete search history.

(56) References Cited

U.S. PATENT DOCUMENTS

| | | | | |
|---|---|---|---|---|
| 3,737,798 A | * | 6/1973 | Faraguet | H03F 1/56 330/51 |
| 5,903,504 A | * | 5/1999 | Chevallier | G11C 5/143 365/189.07 |
| 2007/0291012 A1 | * | 12/2007 | Chang | G06F 3/044 345/173 |
| 2010/0244908 A1 | | 9/2010 | Miyatake et al. | |
| 2011/0068810 A1 | * | 3/2011 | Yeates | G06F 3/0416 324/676 |

* cited by examiner

*Primary Examiner* — Patrick Assouad
*Assistant Examiner* — Taqi Nasir
(74) *Attorney, Agent, or Firm* — WPAT, PC; Justin King

(57) ABSTRACT

A signal sensing circuit is provided. The signal sensing circuit comprises a first current-to-voltage circuit, a second current-to-voltage circuit and an impedance shifting circuit. The first current-to-voltage circuit converts a first input current into a first voltage that is directly proportional to a first impedance. The second current-to-voltage circuit converts a second input current into a second voltage that is directly proportional to a second impedance. The impedance shifting circuit generates a third voltage according to the first voltage, wherein the first impedance/the second impedance=K(first voltage/third voltage), where K is a real number.

8 Claims, 3 Drawing Sheets

SIGNAL SENSING CIRCUIT

CROSS REFERENCE TO RELATED PATENT APPLICATION

This patent application claims the domestic priority of the U.S. provisional application 61/609,466 filed on Mar. 12, 2012, and hereby incorporated by reference.

BACKGROUND OF THE INVENTION

1. Field of the Invention

The present invention relates to a signal sensing circuit, and more particularly, to a signal sensing circuit across integrated circuits.

2. Description of the Prior Art

Referring to FIG. 1, a schematic diagram illustrating a detecting circuit for a capacitive touch sensor is shown. When a driven electrode $T_{x1}$ is provided with an AC driving signal, capacitive couplings will be created between the driven electrode $T_{x1}$ and sensed electrodes $R_{x1}$ and $R_{x2}$ overlapping with the driven electrode $T_{x1}$. Signals of the sensed electrodes $R_{x1}$ and $R_{x2}$ can be converted into output voltages V' and V" by a front-end current sensing circuit, respectively. The output voltages V' and V" are related to the impedance of a reference resistor R. Since background interferences affecting adjacent sensed electrodes will be similar, subtracting the signals of a pair of adjacent sensed electrodes can effectively cancel out the common-mode noise and increase the signal-to-noise (S/N) ratio. Thus, the output voltages V' and V" can be converted into respective digital signals thereof through an A/D converter and subtracted from each other, so as to create a digital signal representing the difference between the output voltages V' and V" by digital subtraction. The output voltages V' and V" can be converted into a digital signal representing the difference between the output voltages V' and V" using an A/D converter as a subtractor, in other words, by analog subtraction.

In order to effectively reduce the interferences, signals of all the sensed electrodes have to be received simultaneously in order to simultaneously eliminate the interferences of the common-mode noise. Thus, the signal of each sensed electrode is coupled to a pin of an integrated circuit (IC). Since the number of pins of the IC coupled with the sensed electrodes is fixed, in the case of a large touch sensor, the number of the sensed electrodes may exceed the number of pins of a single IC used for coupling with the sensed electrodes; as a result, several ICs have to be connected together in series.

Referring now to FIG. 2, when two ICs are connected in series, the signals of a pair of adjacent sensed electrodes may be generated by different ICs. Each IC will have its own manufacturing process variations. Even if the same element adopts the same design, the elements manufactured using the same design may still have variations among them. For example, the same resistors are designed with the same impedance, but the actual impedances after manufacturing may be different due to variations in the manufacturing process, which will influence the associated signals.

For example, an output voltage V' generated based on an input current I' is associated with a reference resistor R', and an output voltage V" generated based on an input current I" is associated with a reference resistor R", wherein the reference resistors R' and R" are supposed to be designed to have the same impedance. In the example of FIG. 1, the output voltages V' and V" are generated in the same IC, and the difference between the output voltages V' and V" is Vd. Assuming manufacturing process variations exist between the first integrated circuit IC1 and the second integrated circuit IC2, the impedance of the reference resistor R1 is k (a constant value) times that of the reference resistor R", thus the difference between the output voltages V' and V" will not be Vd, creating an error. Such an error will vary with the degree of manufacturing process variations, which makes it difficult to determine or correct.

From the above it is clear that prior art still has shortcomings. In order to solve these problems, efforts have long been made in vain, while ordinary products and methods offering no appropriate structures and methods. Thus, there is a need in the industry for a novel technique that solves these problems.

SUMMARY OF THE INVENTION

Integrated circuits of the same design may have differences due to manufacturing process variations. When calculations based on signals of different ICs are required, the manufacturing process variations may result in serious errors. The present invention thus provides a signal sensing circuit across integrated circuits, such that a signal of a first IC inputting into a second IC may be automatically corrected according to the manufacturing process variations between the second IC and the first IC.

The above and other objectives of the present invention can be achieved by the following technical scheme. A signal sensing circuit proposed by the present invention may include: a first current-to-voltage circuit for converting a first input current into a first voltage that is directly proportional to a first impedance; a second current-to-voltage circuit for converting a second input current into a second voltage that is directly proportional to a second impedance; and an impedance shifting circuit for generating a third voltage according to the first voltage, wherein the first impedance/the second impedance=K(first voltage/third voltage), where K is a real number. In an embodiment, K equals 1.

The above and other objectives of the present invention can also be achieved by the following technical scheme. A signal sensing circuit proposed by the present invention may include: a first integrated circuit including: a first input resistor for receiving a first voltage; a first inverting closed-loop amplifier including a first positive input, a first negative input and a first output, the first output forming a first closed loop through a first reference resistor coupled to the first negative input, and the first negative input receiving a first voltage input via the first input resistor, wherein the first input resistor and the first reference resistor are designed to have the same impedance value; a second input resistor coupled to the first output; and a first external pin coupled to the first output via the second input resistor; and a second integrated circuit including: a second external pin electrically coupled to the first external pin outside the second integrated circuit; and a second inverting closed-loop amplifier including a second positive input, a second negative input and a second output, the second output forming a second closed loop through a second reference resistor coupled to the second negative input, and the second negative input coupled to the second input resistor via the second external pin, wherein the second input resistor and the second reference resistor are designed to have the same impedance value.

The above and other objectives of the present invention can also be achieved by the following technical scheme. A signal sensing circuit proposed by the present invention may include: N input voltages arranged in a row forming N−1 pairs of input voltages, wherein the $i^{th}$ input voltage pair is formed by the N−$i^{th}$ input voltage and the N−i+$1^{th}$ input voltage, and N and i are a natural number greater than 1 and a natural number greater than 0 and less than N−1, respectively; a portion of an impedance shifting circuit including: a first input resistor for receiving the $N^{th}$ input voltage; a first inverting closed-loop amplifier including a first positive input, a first negative input and a first output, the first output forming a first closed loop through a first reference resistor coupled to the first negative input, and the first negative input coupled to the $N^{th}$ input voltage via the first input resistor, wherein the first input resistor and the first reference resistor are designed to have the same impedance value; a second input resistor coupled to the first output; and a second portion of the impedance shifting circuit including: a second inverting closed-loop amplifier including a second positive input, a second negative input and a second output, the second output forming a second closed loop through a second reference resistor coupled to the second negative input, and the second output and the $N^{th}$ input voltage forming the $N^{th}$ input voltage pair, wherein the second input resistor and the second reference resistor are designed to have the same impedance value.

With the above technical schemes, the present invention achieves at least the following advantage and beneficial effect: a signal of a first integrated circuit inputting into a second integrated circuit is automatically corrected according to the manufacturing process variations between the second integrated circuit and the first integrated circuit.

The above description is only an outline of the technical schemes of the present invention. Preferred embodiments of the present invention are provided below in conjunction with the attached drawings to enable one with ordinary skill in the art to better understand said and other objectives, features and advantages of the present invention and to make the present invention accordingly.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Figure 1:
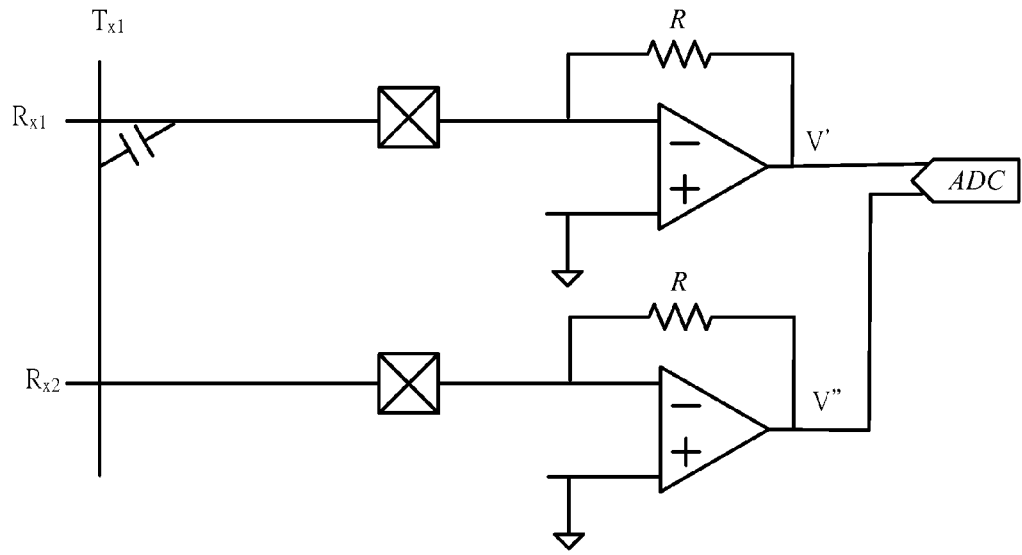
FIG. 1 is a schematic diagram illustrating a detecting circuit for a capacitive touch sensor.
Figure 2:
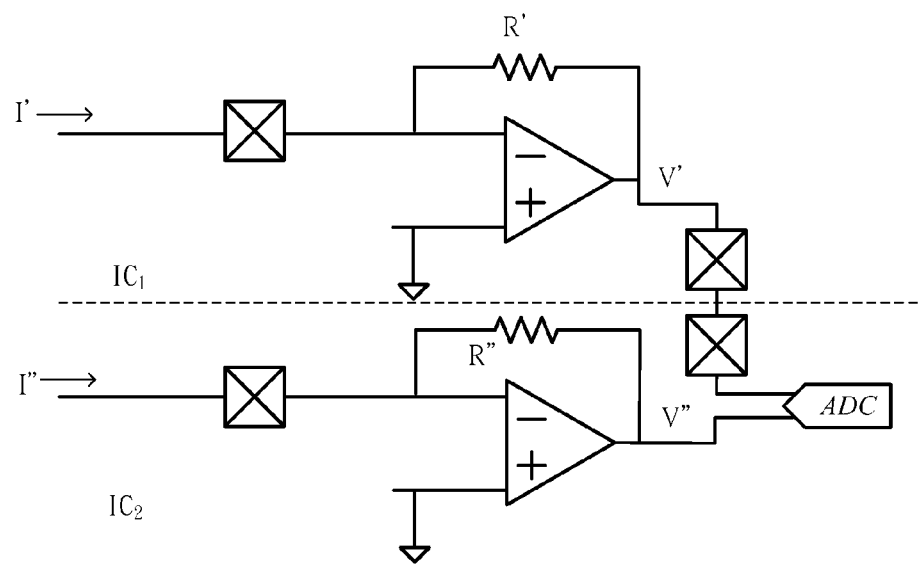
FIG. 2 is a schematic diagram illustrating connections between two detecting circuits for capacitive touch sensors.

Some embodiments of the present invention are described in details below. However, in addition to the descriptions given below, the present invention can be applicable to other embodiments, and the scope of the present invention is not limited by such, rather by the scope of the claims. Moreover, for better understanding and clarity of the description, some components in the drawings may not necessary be drawn to scale, in which some may be exaggerated relative to others, and irrelevant parts are omitted.

The present invention provides a signal sensing circuit, which may include: a first current-to-voltage circuit, a second current-to-voltage circuit and an impedance shifting circuit. The first current-to-voltage circuit converts a first input current into a first voltage that is directly proportional to a first impedance. The second current-to-voltage circuit converts a second input current into a second voltage that is directly proportional to a second impedance, wherein the first current-to-voltage circuit and the second current-to-voltage circuit reside on separate integrated circuits, and the first impedance and the second impedance are designed to have the same impedance value. In addition, the impedance shifting circuit generates a third voltage according to the first voltage, wherein the first impedance/the second impedance=K(the first voltage/the third voltage), where K is a real number. In an embodiment, K equals 1, i.e. the first impedance/the second impedance=the first voltage/the third voltage. Moreover, a first portion of the impedance shifting circuit and the first current-to-voltage circuit reside on the same integrated circuit, and a second portion of the impedance shifting circuit and the second current-to-voltage circuit reside on the same integrated circuit.

Figure 3:
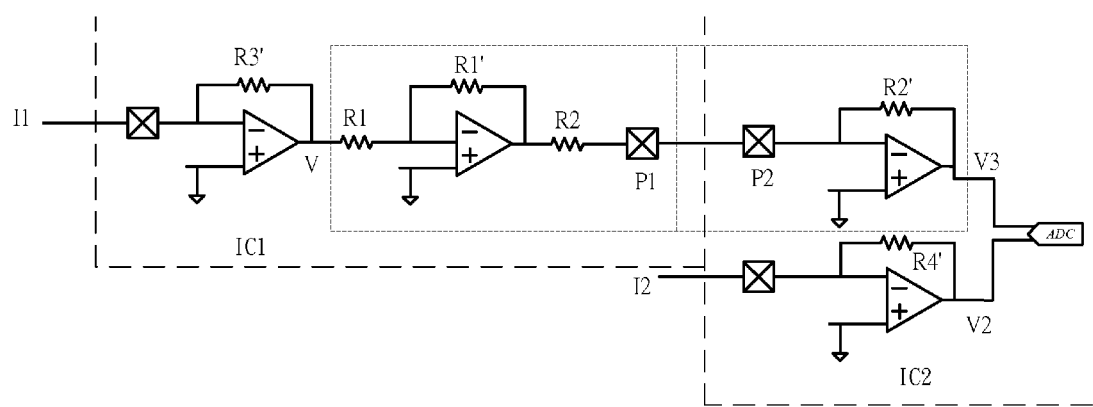
FIG. 3 is a schematic diagram illustrating a signal sensing circuit across integrated circuits in accordance with the present invention.

Referring to FIG. 3, a schematic diagram illustrating a signal sensing circuit proposed by the present invention. The first portion of the impedance shifting circuit described before may include a first input resistor R1, a first inverting closed-loop amplifier and a second input resistor R2. The first input resistor R1 receives a first voltage V. The first inverting closed-loop amplifier includes a first positive input, a first negative input and a first output. The first output forms a first closed loop through a first reference resistor R1' coupled to the first negative input, and the first negative input receives the first voltage input V via the first input resistor R1, wherein the first input resistor R1 and the first reference resistor R1' are designed to have the same impedance value. In addition, the second input resistor R2 is coupled to the first output, which receives a voltage of the first output.

The second portion of the impedance shifting circuit described before may be a second inverting closed-loop amplifier, which includes a second positive input, a second negative input and a second output. The second output forms a second closed loop through a second reference resistor R2' coupled to the second negative input, and the second negative input is coupled with the second input resistor R2 via a second external pin, wherein the second input resistor and the second reference resistor are designed to have the same impedance value. In addition, the second output generates a third voltage V3.

In an example of the present invention, the first and second portions of the impedance shifting circuit reside on a first integrated circuit IC1 and a second integrated circuit IC2, respectively, and are coupled to each other through a first external pin P1 of the first integrated circuit IC1 and a second external pin P2 of the second integrated circuit IC2. The first external pin P1 and the second external pin P2 can be pins outside the packaged integrated circuits and used as interfaces for coupling the inside of the ICs to the outside.

The impedance shifting circuit mentioned above is merely an example of the present invention, and the present invention is not limited to this. The impedance shifting circuit generates the third voltage V3 based on the first voltage V. Since the second input resistor R2 of the first portion of the impedance shifting circuit on the first integrated circuit is designed to have the same impedance value as the second reference resistor R2' of the second portion of the impedance shifting circuit on the second integrated circuit, if the actual impedance values of the second input resistor R2 and the second reference resistor R2' are the same, the first voltage V will be equal to the third voltage V3.

In addition, the above first current-to-voltage circuit can be a third inverting closed-loop amplifier, which includes a third positive input, a third negative input and a third output. The third output forms a third closed loop through a third reference resistor R3' coupled to the third negative input, and the third negative input receives a first input current I1. Moreover, the above second current-to-voltage circuit can be a fourth inverting closed-loop amplifier, which includes a fourth positive input, a fourth negative input and a fourth output. The fourth output forms a fourth closed loop through a fourth reference resistor R4' coupled to the fourth negative input, and the fourth negative input receives a second input current I1. Furthermore, the third reference resistor R3' and the fourth reference resistor R4' are designed to have the same impedance value.

The first current-to-voltage circuit and the second current-to-voltage circuit mentioned above are merely examples of the present invention, and the present invention is not limited to these. One with ordinary skill in the art can appreciate the implementations of other current-to-voltage circuits, and they will not be described in details herein. In other words, a current-to-voltage circuit applicable to the present invention can be any equivalent circuit that converts an input current into an output voltage which is directly proportional to a reference impedance of the current-to-voltage circuit.

Thus, the ratio between the (actual) impedance of the third reference resistor R3' and the (actual) impedance of the fourth reference resistor R4'=the ratio between the (actual) impedance of the second input resistor R2 and the (actual) impedance of the second reference resistor R2'=the voltage of the third output/the voltage of the second output. In other words, the error in the first voltage due to manufacturing process variations will be corrected by the current-to-voltage circuits.

The present invention may further include a subtractor for generating a difference between the signal of the second output and the signal of the fourth output, that is, a difference between the third voltage and the second voltage. In an example of the present invention, the subtractor can be implemented with an A/D converter, and the difference between the signal of the second output and the signal of the fourth output is a digital signal.

Figure 4:
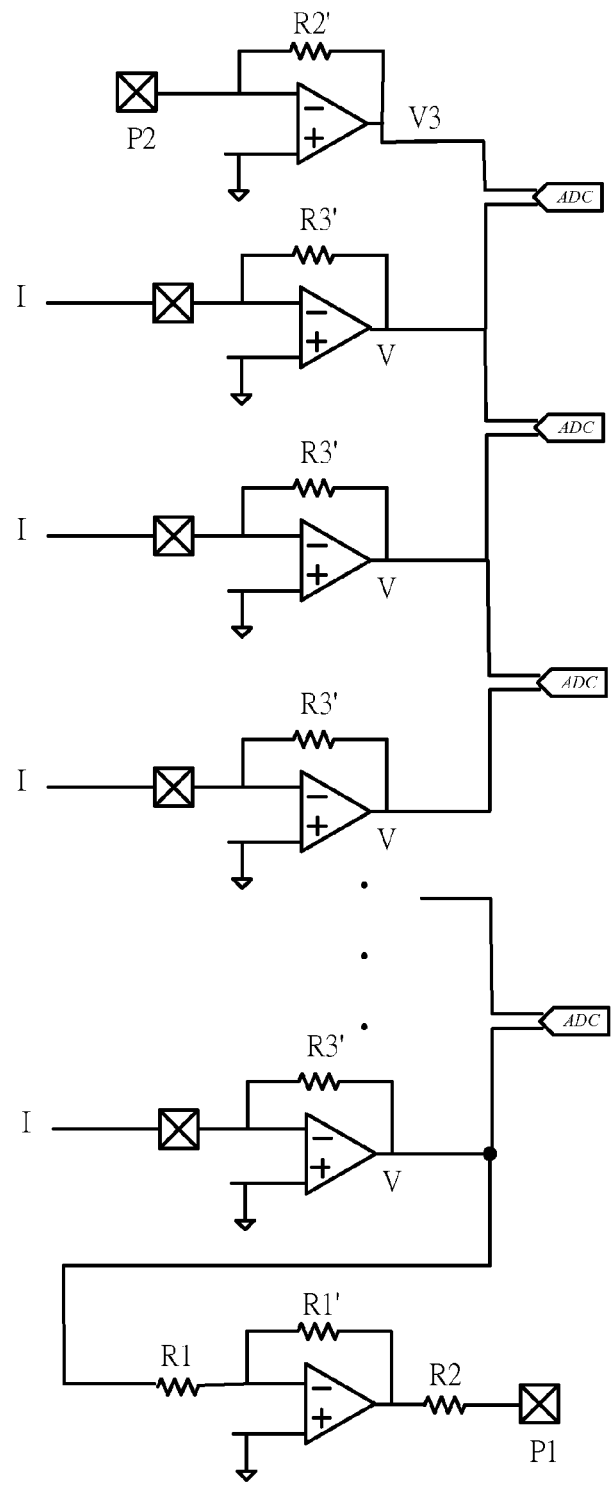
FIG. 4 is a schematic diagram illustrating a signal sensing circuit inside an integrated circuit in accordance with the present invention.

In an example of the present invention, the first integrated circuit IC1 and the second integrated circuit IC2 have the same design. Referring now to FIG. 4, a schematic diagram illustrating another signal sensing circuit in accordance with another example of the present invention is shown. The signal sensing circuit may include N first current-to-voltage circuits as described above, each for converting a first input current to a first voltage that is directly proportional to a first impedance; and a first portion and a second portion of an impedance shifting circuit.

In this example, an example of the first current-to-voltage circuits can be the aforementioned third inverting closed-loop amplifier. Each third inverting closed-loop amplifier, which includes a third positive input, a third negative input and a third output. The third output forms a third closed loop through a third reference resistor R3 coupled to the third negative input, wherein each third negative input receives an input current I, and each third inverting closed-loop amplifier provides a first voltage V based on the received input current I. In addition, each third reference resistor R3 may be designed to have the same impedance.

The first portion of the impedance shifting circuit may include a first input resistor R1, a first inverting closed-loop amplifier and a second input resistor R2. The first input resistor R1 receives the first voltage V. The first inverting closed-loop amplifier includes a first positive input, a first negative input and a first output. The first output forms a first closed loop through a first reference resistor R1' coupled to the first negative input, and the first negative input is coupled to the $N^{th}$ first voltage input V via the first input resistor R1, wherein the first input resistor R1 and the first reference resistor R1' are designed to have the same impedance value. In addition, the second input resistor R2 is coupled to the first output, which receives a voltage of the first output.

The second portion of the impedance shifting circuit may be a second inverting closed-loop amplifier, which includes a second positive input, a second negative input and a second output. The second output forms a second closed loop through a second reference resistor R2' coupled to the second negative input, and the second output and the first first voltage V form an $N^{th}$ pair of input voltages, wherein the second input resistor R2 and the second reference resistor R2' are designed to have the same impedance value. In addition, the second output generates a third voltage V3.

The present invention may further include N subtractors arranged in a row. Each subtractor calculates a difference between a pair of input voltages, wherein the $j^{th}$ subtractor calculates a difference between a $j^{th}$ pair of input voltages, wherein j is a natural number greater than 0 and less than N. Each subtractor can be an A/D converter and the calculated difference is a digital signal. One with ordinary skill in the art can appreciate that the subtractors can be implemented by differential amplifiers or other types of subtractor circuits.

The signal sensing circuit shown in FIG. 4 can be integrated into an integrated circuit. When two integrated circuits of the same design are connected in series, a first external pin P1 of the first integrated circuit is coupled to a second external pin P2 of the second integrated circuit.

The above embodiments are only used to illustrate the principles of the present invention, and they should not be construed as to limit the present invention in any way. The above embodiments can be modified by those with ordinary skill in the art without departing from the scope of the present invention as defined in the following appended claims.

What is claimed is:

1. A signal sensing circuit comprising:
a first current-to-voltage circuit for converting a first input current into a first voltage that is directly proportional to a first impedance;
a second current-to-voltage circuit for converting a second input current into a second voltage that is directly proportional to a second impedance; and
an impedance shifting circuit for generating a third voltage according to the first voltage,
wherein the first impedance/the second impedance=K(first voltage/third voltage), where K is a real number.

2. The signal sensing circuit of claim 1, wherein the first current-to-voltage circuit and the second current-to-voltage circuit reside on separate integrated circuits, and the first impedance and the second impedance are designed to have the same impedance value.

3. The signal sensing circuit of claim 2, wherein a first portion of the impedance shifting circuit and the first current-to-voltage circuit reside on the same integrate circuit, and a second portion of the impedance shifting circuit and the second current-to-voltage circuit reside on the same integrate circuit.

4. The signal sensing circuit of claim 1, wherein K equals 1.

5. A signal sensing circuit comprising:
a first integrated circuit including:
a first input resistor for receiving a first voltage;
a first inverting closed-loop amplifier including a first positive input, a first negative input and a first output, the first output forming a first closed loop through a first reference resistor coupled to the first negative input, and the first negative input receiving a first voltage input via the first input resistor, wherein the first input resistor and the first reference resistor are designed to have the same impedance value;

a second input resistor coupled to the first output;

a first external pin coupled to the first output via the second input resistor; and a third inverting closed-loop amplifier including a third positive input, a third negative input and a third output, the third output forming a third closed loop through a third reference resistor coupled to the third negative input, and the third negative input receiving a first input current; and a second integrated circuit including:

a second external pin electrically coupled to the first external pin outside the second integrated circuit;

a second inverting closed-loop amplifier including a second positive input, a second negative input and a second output, the second output forming a second closed loop through a second reference resistor coupled to the second negative input, and the second negative input coupled to the second input resistor via the second external pin, wherein the second input resistor and the second reference resistor are designed to have the same impedance value; and a fourth inverting closed-loop amplifier including a fourth positive input, a fourth negative input and a fourth output, the fourth output forming a fourth closed loop through a fourth reference resistor coupled to the fourth negative input, and the fourth negative input receiving a second input current, wherein the third reference resistor and the fourth reference resistor are designed to have the same impedance value, the impedance of the third reference resistor/the impedance of the fourth reference resistor=K(the voltage of the third output/the voltage of the second output), where K is a real number.

6. The signal sensing circuit of claim 5, wherein K equals 1.

7. The signal sensing circuit of claim 5 further comprising: a subtractor for generating a difference between a signal of the second output and a signal of the fourth output.

8. The signal sensing circuit of claim 7, wherein the subtractor is an analog-to-digital (A/D) converter, and the difference between the signal of the second output and the signal of the fourth output is a digital signal.

* * * * *